US012777940B2

United States Patent
(12) United States Patent
Moon et al.

(10) Patent No.: US 12,777,940 B2
(45) Date of Patent: Oct. 27, 2026

(54) SEMICONDUCTOR DEVICE AND METHOD OF SELECTIVE SHIELDING USING FOD MATERIAL

(71) Applicant: STATS ChipPAC Pte. Ltd., Singapore (SG)

(72) Inventors: JiSik Moon, Incheon (KR); YoungSang Kim, Gyeonggi-do (KR); JiEun Kwon, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 744 days.

(21) Appl. No.: 17/806,241

(22) Filed: Jun. 9, 2022

(65) Prior Publication Data

US 2023/0402397 A1 Dec. 14, 2023

(51) Int. Cl.

*H10W 42/20* (2026.01)
*H10W 44/20* (2026.01)
*H10W 70/05* (2026.01)
*H10W 70/60* (2026.01)
*H10W 70/65* (2026.01)

(Continued)

(52) U.S. Cl.

CPC ......... *H10W 42/20* (2026.01); *H10W 42/273* (2026.01); *H10W 42/276* (2026.01); *H10W 44/20* (2026.01); *H10W 70/05* (2026.01); *H10W 70/65* (2026.01); *H10W 74/012* (2026.01); *H10W 74/016* (2026.01);

(Continued)

(58) Field of Classification Search

CPC ............... H01L 23/552; H01L 25/0655; H01L 21/4846; H01L 21/565; H10W 40/20; H10W 70/05; H10W 72/075; H10W 74/016; H10W 74/114; H10W 42/20; H10W 42/273; H10W 42/276; H10W 44/20; H10W 70/65; H10W 74/012; H10W 70/611

See application file for complete search history.

(56) References Cited

U.S. PATENT DOCUMENTS 8,786,060 B2 * 7/2014 Yen ...................... H01Q 1/2283 438/63
8,813,354 B2 * 8/2014 Wu ........................ H05K 9/003 29/830

(Continued)

*Primary Examiner* — Dale E Page
*Assistant Examiner* — Genevieve G Bullard-Connor
(74) *Attorney, Agent, or Firm* — Robert D. Atkins; PATENT LAW GROUP

(57) ABSTRACT

A semiconductor device has a substrate and first electrical component disposed over the substrate. A first shielding layer is disposed over the first electrical component. A first film material is disposed between the first electrical component and first shielding layer for selective attachment of the first shielding layer. A second electrical component can be disposed over the substrate. A second shielding layer is disposed over the second electrical component, and a second film material disposed between the second electrical component and second shielding layer. A third shielding layer can be disposed over the first shielding layer, and a third film material disposed between the first shielding layer and third shielding layer. A fourth film material can be disposed between the first electrical component and substrate. An encapsulant is deposited over the first electrical component and substrate. A fourth shielding layer is formed over the encapsulant.

33 Claims, 14 Drawing Sheets

(51) Int. Cl.
*H10W 74/01* (2026.01)
*H10W 74/10* (2026.01)
*H10W 72/00* (2026.01)

(52) U.S. Cl.
CPC ........ *H10W 74/114* (2026.01); *H10W 70/611* (2026.01); *H10W 72/075* (2026.01)

(56) References Cited

U.S. PATENT DOCUMENTS

| | | | | |
|---|---|---|---|---|
| 9,269,673 | B1 * | 2/2016 | Lin | H10W 42/20 |
| 9,553,072 | B2 | 1/2017 | Yang et al. | |
| 9,748,160 | B2 * | 8/2017 | Kim | H10W 74/121 |
| 9,953,932 | B2 * | 4/2018 | Kawabata | H10P 14/412 |
| 9,953,933 | B1 * | 4/2018 | Cadag | B32B 27/06 |
| 10,438,901 | B1 * | 10/2019 | Krefft | H10W 42/20 |
| 10,455,748 | B2 * | 10/2019 | Yamamoto | B32B 15/08 |
| 11,900,197 | B1 * | 2/2024 | Tang | G06K 19/0723 |
| 12,119,308 | B2 * | 10/2024 | Miao | H10W 42/20 |
| 2009/0166819 | A1 * | 7/2009 | Chen | B82Y 30/00 257/659 |
| 2010/0270688 | A1 * | 10/2010 | Su | H10W 90/00 257/777 |
| 2012/0020039 | A1 * | 1/2012 | Coffy | H05K 3/284 29/829 |
| 2014/0284775 | A1 * | 9/2014 | Nomura | H10W 42/20 257/659 |
| 2018/0033738 | A1 * | 2/2018 | Kawabata | H10P 14/412 |
| 2018/0076146 | A1 * | 3/2018 | Takaku | H10W 20/423 |
| 2018/0158782 | A1 * | 6/2018 | Kawabata | H10W 42/20 |
| 2018/0323170 | A1 * | 11/2018 | Kim | H10W 42/20 |
| 2020/0075502 | A1 * | 3/2020 | Kim | H01Q 1/2283 |
| 2020/0161252 | A1 * | 5/2020 | Yang | H10P 72/74 |
| 2020/0402714 | A1 * | 12/2020 | Yoon | H01G 2/065 |
| 2021/0035917 | A1 * | 2/2021 | Fay | H01Q 1/2283 |
| 2021/0257346 | A1 | 8/2021 | Baloglu et al. | |
| 2021/0407927 | A1 | 12/2021 | Salmon et al. | |
| 2022/0095496 | A1 * | 3/2022 | Nomura | H05K 1/0216 |
| 2022/0102239 | A1 * | 3/2022 | Kamoda | H10W 40/22 |
| 2022/0246597 | A1 * | 8/2022 | Shibata | H05K 3/00 |
| 2023/0078099 | A1 * | 3/2023 | Ecton | H01L 21/486 257/773 |
| 2023/0103130 | A1 * | 3/2023 | Otsubo | H05K 1/0216 361/748 |

* cited by examiner

SEMICONDUCTOR DEVICE AND METHOD OF SELECTIVE SHIELDING USING FOD MATERIAL

FIELD OF THE INVENTION

The present invention relates in general to semiconductor devices and, more particularly, to a semiconductor device and method of selective shielding using FOD material.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices, particularly in high frequency applications, such as radio frequency (RF) wireless communications, often contain one or more integrated passive devices (IPDs) to perform necessary electrical functions. Multiple semiconductor die and IPDs can be integrated into an SiP module for higher density in a small space and extended electrical functionality. Within the SIP module, semiconductor die and IPDs are mounted to a substrate for structural support and electrical interconnect. An encapsulant is deposited over the semiconductor die, IPDs, and substrate. An electromagnetic shielding layer is commonly formed over the encapsulant.

The SIP module includes high speed digital and RF electrical components, highly integrated for small size and low height, and operating at high clock frequencies. The electromagnetic shielding layer reduces or inhibits EMI, RFI, and other inter-device interference, for example as radiated by high-speed digital devices, from affecting neighboring devices within or adjacent to SIP module. In addition, discrete or individual shielding structures can be placed around one or more components within the SIP module. However, these internal shielding structures must be supported by the substrate or external shielding layer. The internal shielding structures require space and increase the overall size of the package, resulting in low-density electrical functionality. Yet the trend should be toward effective shielding with high-density electrical functionality.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
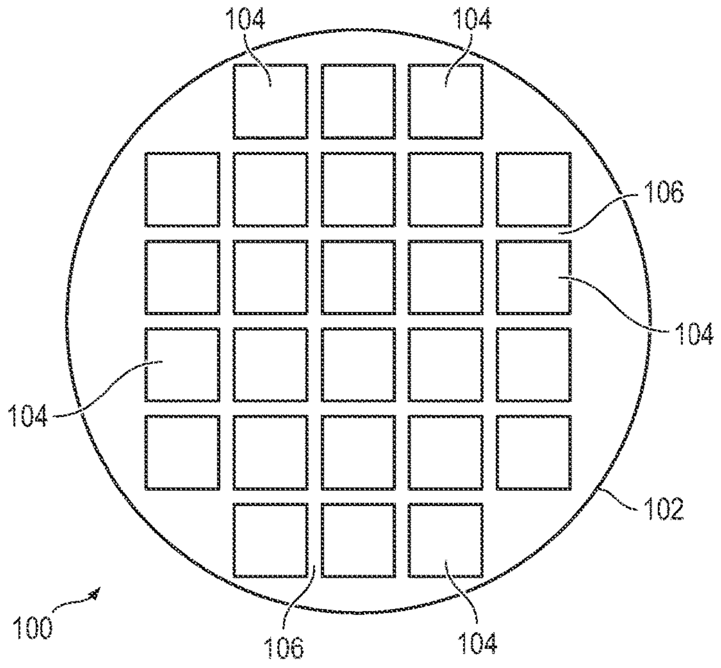
FIGS. 1*a*-1*c* illustrate a semiconductor wafer with a plurality of semiconductor die separated by a saw street.

FIG. 1*a* shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
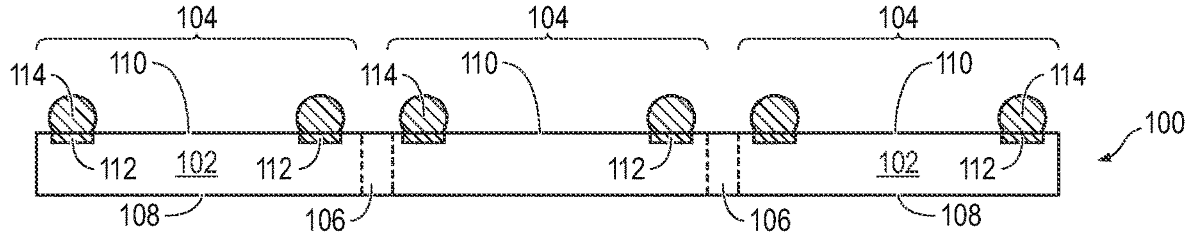

FIG. 1*b* shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
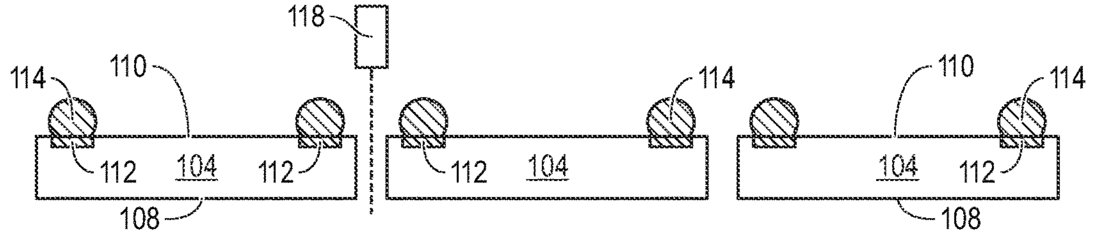

In FIG. 1*c*, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
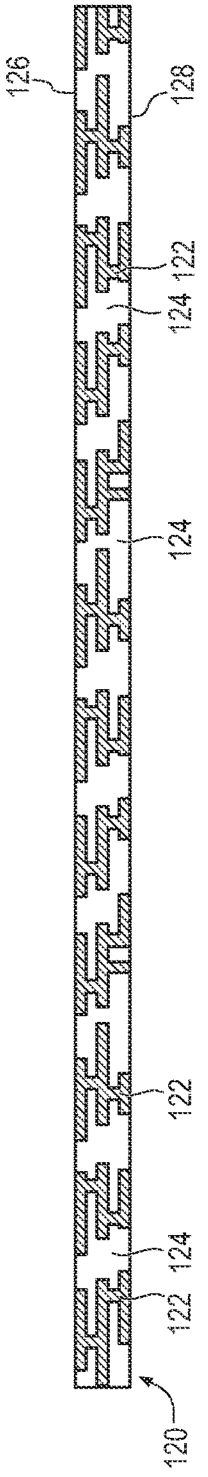
FIGS. 2*a*-2*j* illustrate a process of selective shielding with FOD material.

FIGS. 2*a*-2*j* illustrate a process of forming selective shielding attached with film over die (FOD) material. FIG. 2*a* shows a cross-sectional view of multi-layered interconnect substrate 120 including conductive layers 122 and insulating layer 124. Conductive layer 122 can be one or more layers of Al, Cu, Sn, Ni, Au, Ag, or other suitable electrically conductive material. Conductive layer 122 provides horizontal electrical interconnect across substrate 120 and vertical electrical interconnect between top surface 126 and bottom surface 128 of substrate 120. Portions of conductive layer 122 can be electrically common or electrically isolated depending on the design and function of semiconductor die 104 and other electrical components. Insulating layer 124 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), solder resist, polyimide, benzocyclobutene (BCB), polybenzoxazoles (PBO), and other material having similar insulating and structural properties. Insulating layer 124 provides isolation between conductive layers 122.

Figure 2B:
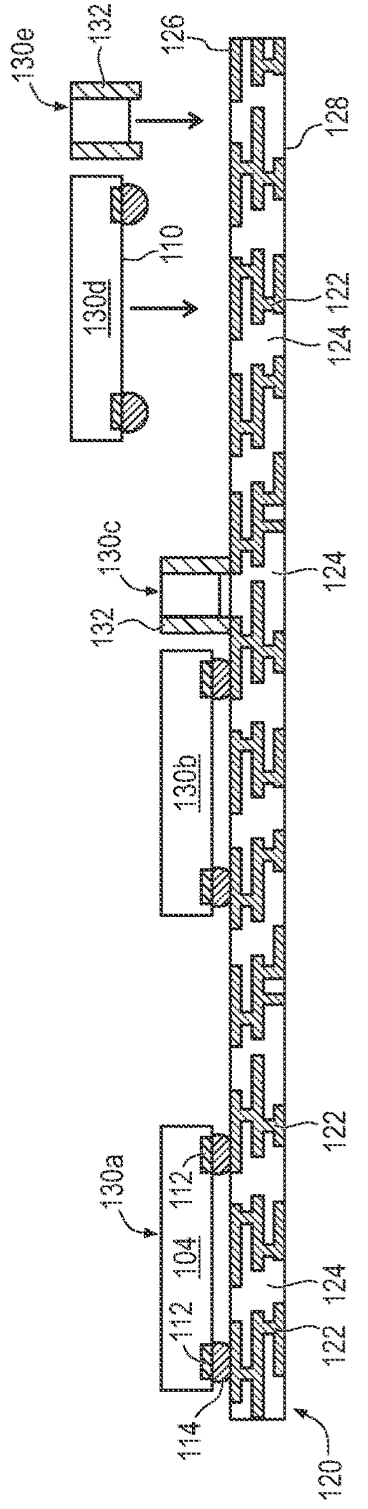
Figure 2C:
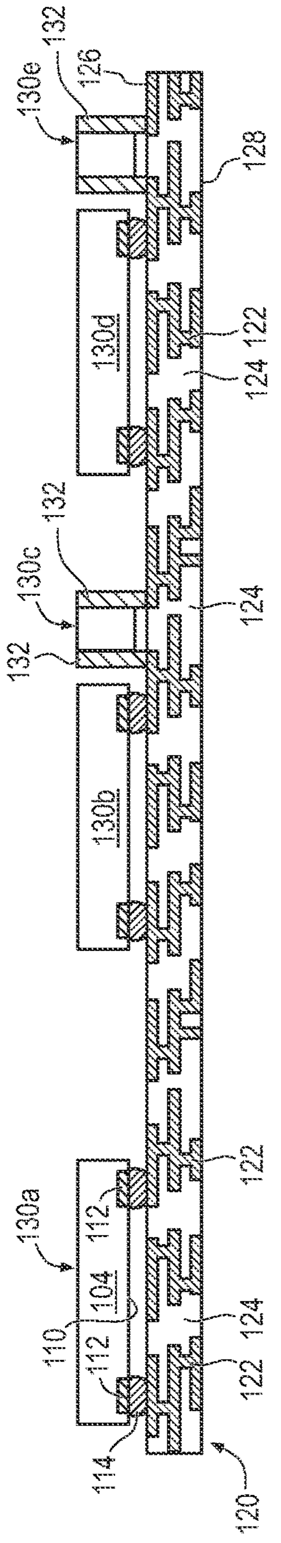

In FIG. 2*b*, a plurality of electrical components 130*a*-130*e* is mounted to surface 126 of interconnect substrate 120 and electrically and mechanically connected to conductive layers 122. Electrical components 130*a*-130*e* are each positioned over substrate 120 using a pick and place operation. For example, electrical component 130*a* can be similar to semiconductor die 104 from FIG. 1*c*, with active surface 110 and bumps 114 oriented toward surface 126 of substrate 120. Electrical components 130*b* and 130*d* can be similar to semiconductor die 104, although possibly having a different form and function, with active surface 110 and bumps 114 oriented toward surface 126 of substrate 120. Electrical components 130*c* and 130*e* can be discrete devices with external electrically conductive terminals 132 oriented toward surface 126 of substrate 120. Alternatively, electrical components 130*a*-130*e* can include other semiconductor die, semiconductor packages, surface mount devices, RF component, discrete electrical devices, or IPDs, such as a resistor, capacitor, and inductor. FIG. 2*c* illustrates electrical components 130*a*-130*e* electrically and mechanically connected to conductive layers 122 of substrate 120.

Figure 2D:
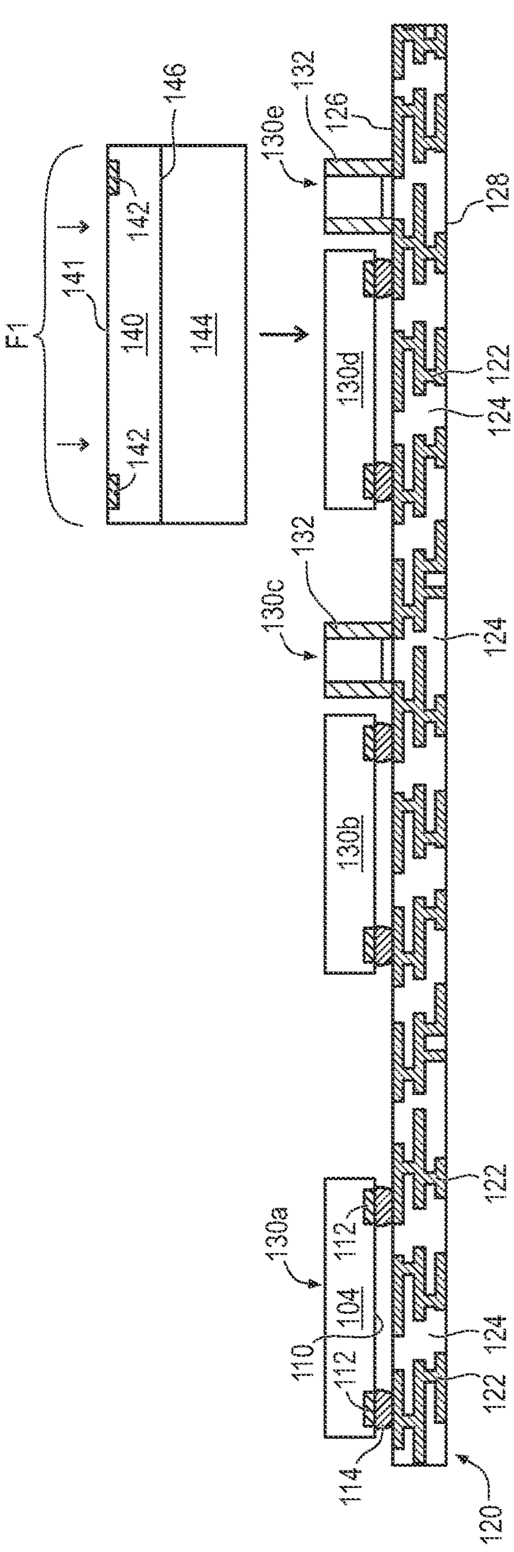
Figure 2E:
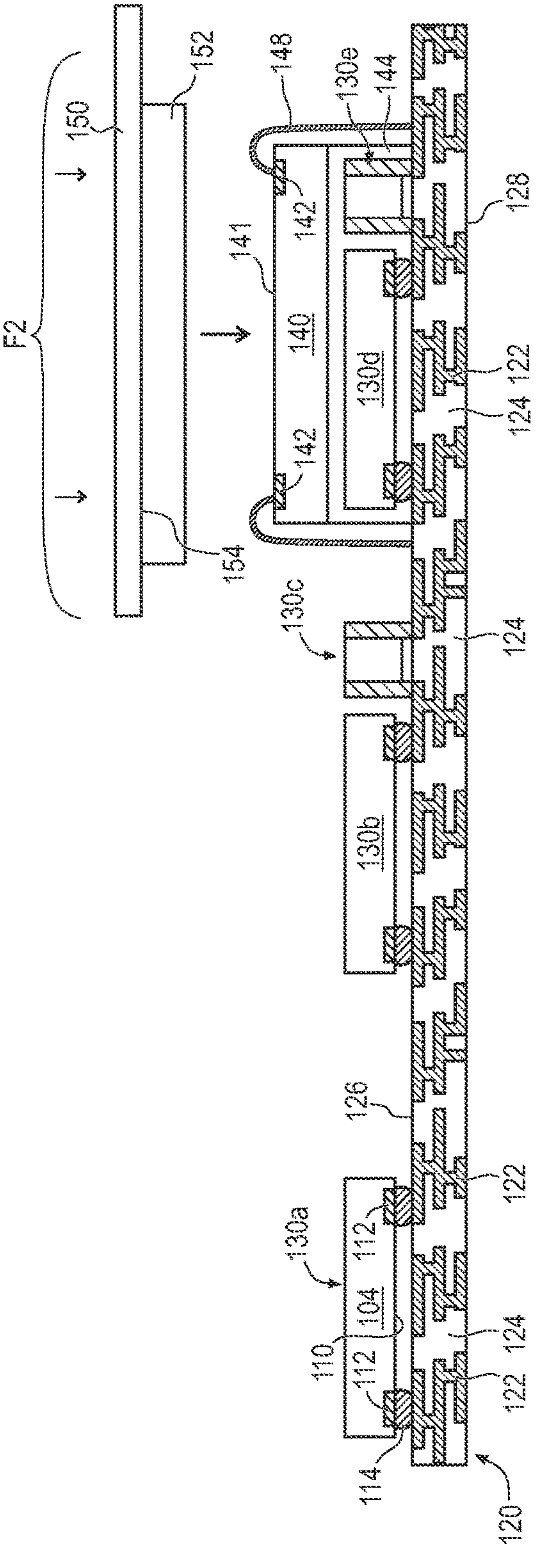

In FIG. 2*d*, electrical component 140 is positioned over electrical components 130*d*-130*e* above substrate 120 using a pick and place operation. Electrical component 140 can be similar to semiconductor die 104 from FIG. 1*c*, although possibly having a different form and function, with active surface 141 and contact pads 142 oriented away from surface 126 of substrate 120. Alternatively, electrical component 140 can include other semiconductor die, semiconductor packages, surface mount devices, RF component, discrete electrical devices, or IPDs, such as a resistor, capacitor, and inductor. FOD material 144 is formed or deposited on back surface 146 of electrical component 140 and oriented toward electrical components 130*d*-130*e*. FOD material 144 can be a penetrable thin film, polymer, epoxy, acryl-based B-stage material, or other similar material with penetrable properties. FOD material 144 is pressed over electrical components 130*d*-130*e*, with force F1, to cover or enclose the components within the FOD material, as shown in FIG. 2*e*. FOD material 144 provides a point of attachment between electrical component 140 and electrical components 130*d*-130*e* for mechanical and structural support.

Alternatively, FOD material 144 is formed or deposited over electrical components 130*d*-130*e*, and then electrical component 140 is pressed onto the FOD material to cover or enclose the components within the FOD material.

Bond wires 148 are formed between contact pads 142 on active surface 141 of electrical component 140 and conductive layer 122 on interconnect substrate 120. Bond wires 148 provide electrical interconnect between electrical component 140 and interconnect substrate 120.

Electrical components 130*a*-130*e* may contain IPDs that are susceptible to or generate EMI, RFI, harmonic distortion, and inter-device interference. For example, the IPDs contained within electrical components 130*a*-130*e* provide the electrical characteristics needed for high-frequency applications, such as resonators, high-pass filters, low-pass filters, band-pass filters, symmetric Hi-Q resonant transformers, and tuning capacitors. In another embodiment, electrical components 130*a*-130*e* contain digital circuits switching at a high frequency, which could interfere with the operation of IPDs.

In FIG. 2*e*, electromagnetic shielding layer 150 is positioned over electrical components 130*d*-130*e*, 140, and surface 126 of interconnect substrate 120. Shielding layer 150 can be one or more layers of Al, Cu, Sn, Ni, Au, Ag, or other suitable conductive material. Alternatively, shielding layer 150 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. FOD material 152 is formed or deposited on surface 154 of shielding layer 150 and oriented toward electrical components 130*d*-130*e* and 140. FOD material 152 can be a penetrable thin film, polymer, epoxy, acryl-based B-stage material, or other similar material with penetrable properties.

Figure 2F:
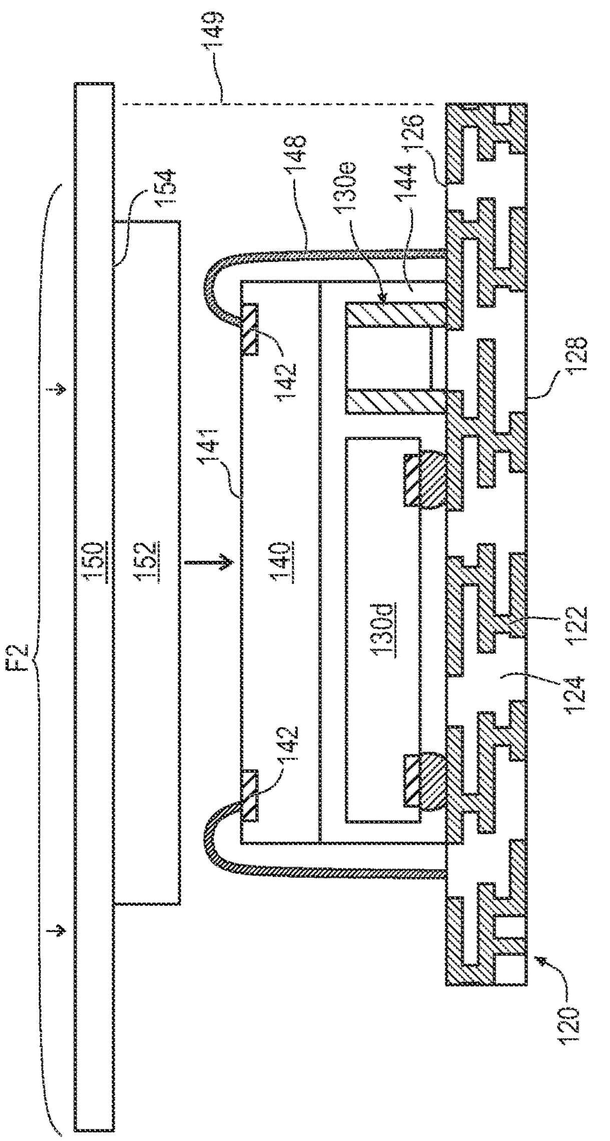

FIG. 2*f* illustrates further detail of substrate 120, electrical components 130*d*-130*e*, FOD material 144, electrical component 140, bond wires 148, shielding layer 150, and FOD material 152, in isolation. FOD material 152 is pressed over bond wires 148 extending from electrical component 140, with force F2, to cover or enclose the bond wires within the FOD material. FOD material 152 provides a point of attachment between shielding layer 150 and surface 141 of electrical component 140 and bond wires 148 for mechanical and structural support for selective placement of the shielding layer. That is, shielding layer 150 can be placed in any desired or selected location and attached to the adjacent component with FOD material. In this case, electrical component 140 and bond wires 148, being the adjacent component, can be used as the attachment or anchor point for shielding layer 150 using FOD material 152. Shielding layer 150 may extend slightly beyond alignment with substrate 120, as shown by dashed line 149.

Figure 2G:
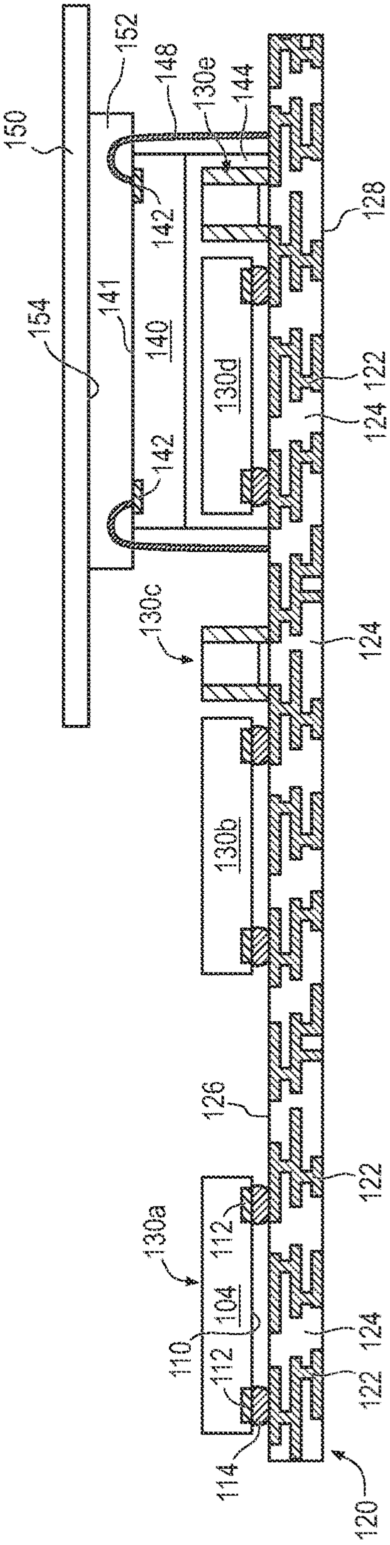
Figure 2H:
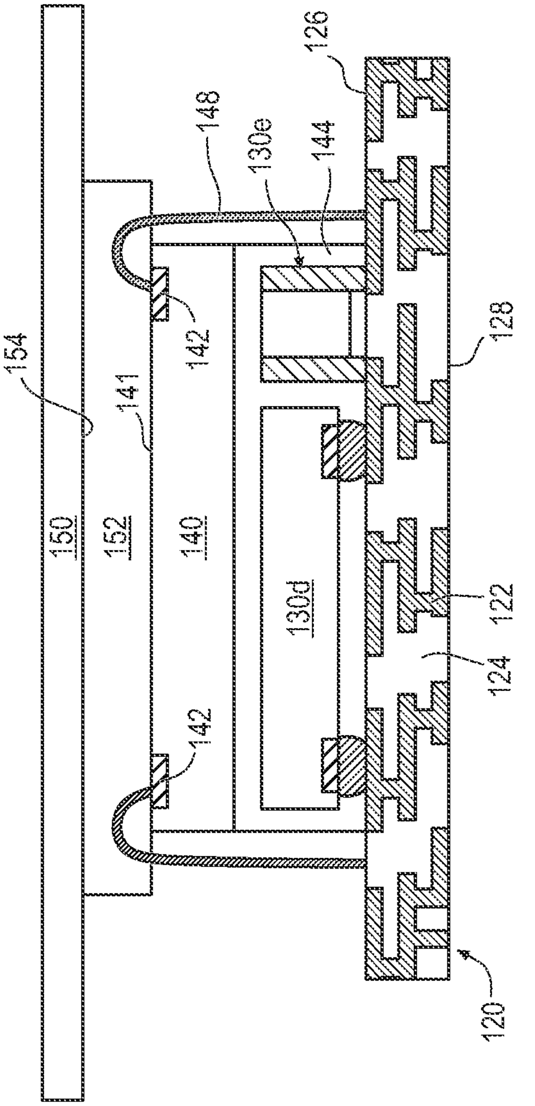

FIG. 2*g* illustrates shielding layer 150 pressed over bond wires 148 extending from electrical component 140 to cover or enclose the bond wires within FOD material 152. FIG. 2*h* illustrates further detail of substrate 120, electrical components 130*d*-130*e*, FOD material 144, electrical component 140, bond wires 148, spieling layer 150, and FOD material 152, in isolation. Again, FOD material 152 is pressed over bond wires 148 extending from electrical component 140 to cover or enclose the bond wires within the FOD material. FOD material 152 is disposed between shielding layer 150 and electrical component 140 and bond wires 148 to provide attachment and mechanical and structural support for selective placement of the shielding layer.

Alternatively, FOD material 152 is formed or deposited over electrical component 140 and bond wires 148, and then shielding layer 150 is pressed onto the FOD material to cover or enclose the components within the FOD material.

Figure 2I:
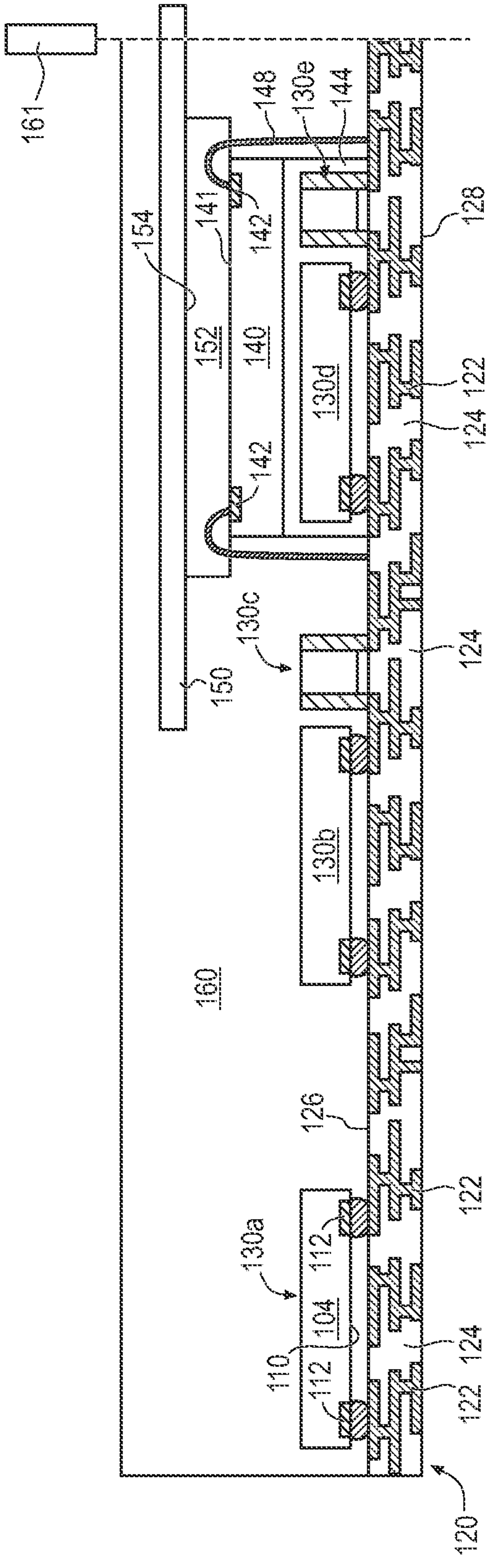

In FIG. 2*i*, an encapsulant or molding compound 160 is deposited over and around electrical components 130*a*-130*e* on substrate 120 using a paste printing, compressive molding, transfer molding, liquid encapsulant molding, vacuum lamination, spin coating, or other suitable applicator. Encapsulant 160 can be polymer composite material, such as epoxy resin with filler, epoxy acrylate with filler, or polymer with proper filler. Encapsulant 160 is non-conductive, provides structural support, and environmentally protects the semiconductor device from external elements and contaminants.

In some cases, shielding layer 150 may extend beyond encapsulant 160, as shown in FIG. 2*i*. The package is singulated by saw blade or laser cutting tool 161 to remove excess portions of shielding layer 150, leaving the shielding layer exposed from encapsulant 160 post singulation.

Figure 2J:
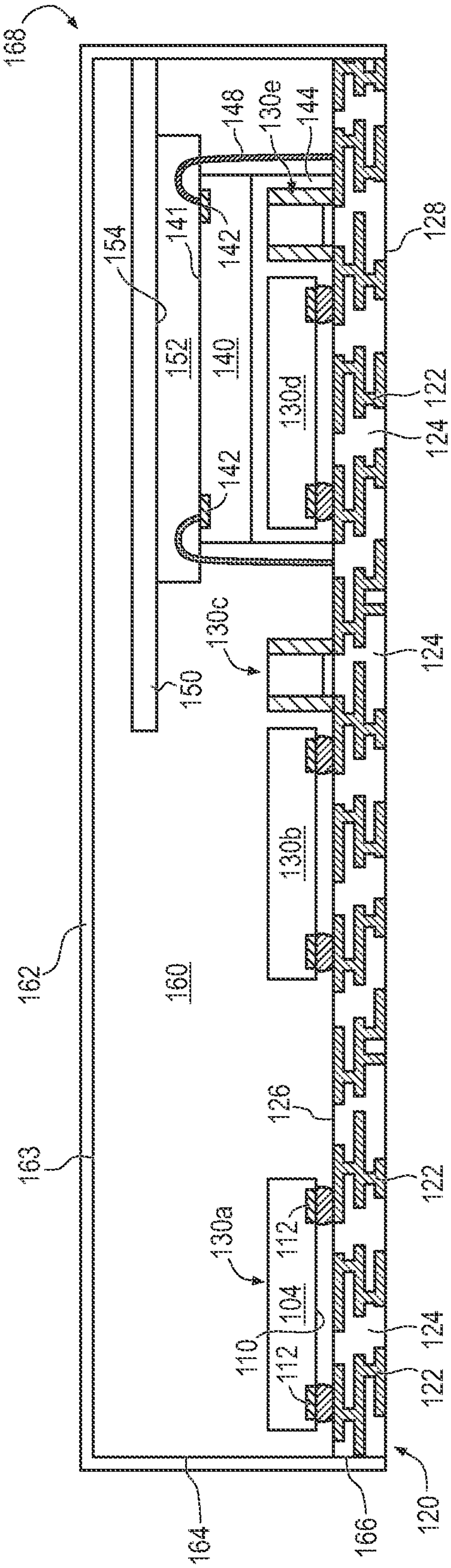

In FIG. 2*j*, an electromagnetic shielding layer 162 is formed or disposed over surface 163 of encapsulant 160 by conformal application of shielding material. Shielding layer 162 can be one or more layers of Al, Cu, Sn, Ni, Au, Ag, or other suitable conductive material. Alternatively, shielding layer 162 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding layer 162 contacts the portion of shielding layer 150 exposed from encapsulant 160. In addition, shielding layer 162 covers side surfaces 164 of encapsulant 160, as well as side surfaces 166 of interconnect substrate 120 to make ground connection to conductive layer 122. Electrical components 130*a*-130*e*, as mounted to interconnect substrate 120 and covered by encapsulant 160 and shielding layer 162, constitute SIP module 168.

SIP module 168 includes high speed digital and RF electrical components 130*a*-130*e*, highly integrated for small size and low height, and operating at high clock frequencies. FOD material 152 provides for attachment of a high density selective shielding structure, i.e., shielding layer 150. By attaching or securing shielding layer 150 with FOD material 152, the shielding layer can be placed in the optimal location for its intended purpose, without the concern for component spacing to support the shielding layer, as described in the background. The mechanical and structural support for selective placement of shielding layer 150 is provided by FOD material 152. Shielding layer 150 can be placed in any desired or selected location and attached to the adjacent component with FOD material. In this case, electrical component 140 and bond wires 148, being the adjacent component, can be used as the attachment or anchor point for shielding layer 150. Electromagnetic shielding layers 150 and 162 reduce or inhibit EMI, RFI, and other inter-device interference, for example as radiated by high-speed digital devices, from affecting neighboring devices within or adjacent to SIP module 168.

Figure 3:
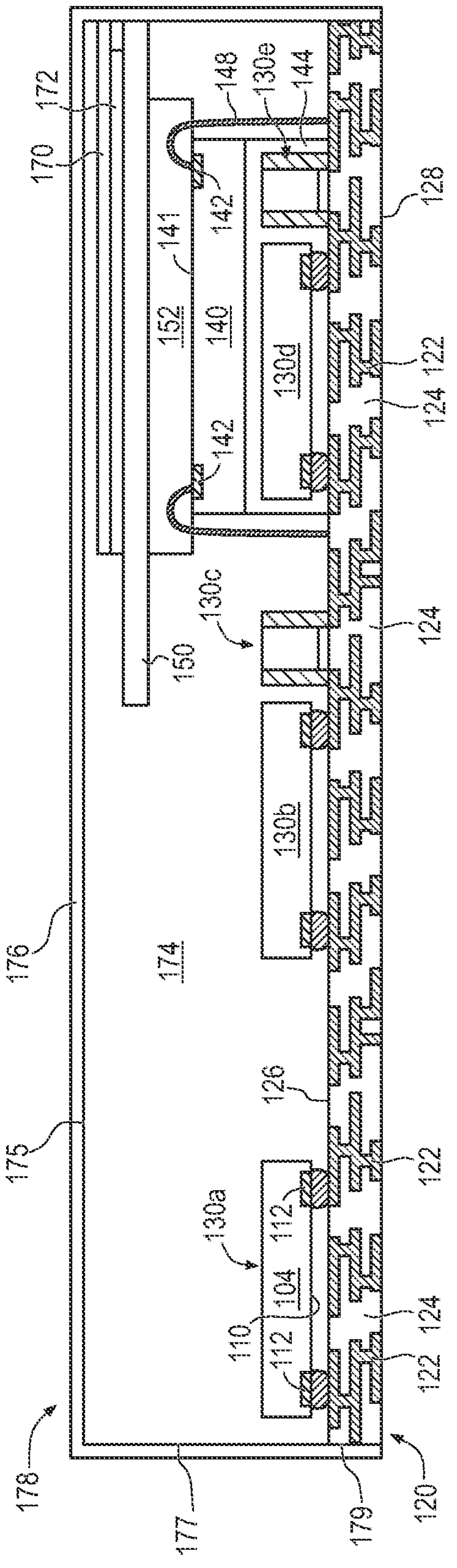
FIG. 3 illustrates an alternate selective shielding with FOD material.

In another embodiment, continuing from FIG. 2*g*, electromagnetic shielding layer 170 is positioned over shielding layer 150, electrical components 130*d*-130*e*, 140, and surface 126 of interconnect substrate 120. In FIG. 3, shielding layer 170 can be one or more layers of Al, Cu, Sn, Ni, Au, Ag, or other suitable conductive material. Alternatively, shielding layer 170 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. FOD material 172 is formed or deposited on a surface of shielding layer 170 and oriented toward shielding layer 150 and electrical components 130*d*-130*e* and 140. FOD material 172 can be a penetrable thin film, polymer, epoxy, acryl-based B-stage material, or other similar material with penetrable properties. Leading with FOD material 172, shielding layer 170 is pressed onto shielding layer 150. FOD material 172 is disposed between shielding layer 170 and shielding layer 150 to provide attachment and mechanical and structural support for selective placement of the shielding layer. Shielding layer 150, being the adjacent component, can be used as the attachment or anchor point for shielding layer 170 using FOD material 172.

Alternatively, FOD material 172 is formed or deposited over shielding layer 150, and then shielding layer 170 is pressed onto the FOD material.

An encapsulant or molding compound 174 is deposited over and around electrical components 130*a*-130*e* on substrate 120 using a paste printing, compressive molding, transfer molding, liquid encapsulant molding, vacuum lamination, spin coating, or other suitable applicator. Encapsulant 174 can be polymer composite material, such as epoxy resin with filler, epoxy acrylate with filler, or polymer with proper filler. Encapsulant 174 is non-conductive, provides structural support, and environmentally protects the semiconductor device from external elements and contaminants. Any portions of shield layers 150 and 170 extending beyond encapsulant 174 are singulated, similar to FIG. 2*i*. Shielding layers 150 and 170 are exposed from encapsulant 174 post singulation.

An electromagnetic shielding layer 176 is formed or disposed over surface 175 of encapsulant 174 by conformal application of shielding material. Shielding layer 176 can be one or more layers of Al, Cu, Sn, Ni, Au, Ag, or other suitable conductive material. Alternatively, shielding layer 176 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding layer 176 contacts the portion of shielding layer 150 and 170 exposed from encapsulant 174. In addition, shielding layer 176 covers side surfaces 177 of encapsulant 174, as well as side surfaces 179 of interconnect substrate 120. Electrical components 130*a*-130*e*, as mounted to interconnect substrate 120 and covered by encapsulant 174 and shielding layer 176, constitute SIP module 178.

SIP module 178 includes high speed digital and RF electrical components 130*a*-130*e*, highly integrated for small size and low height, and operating at high clock frequencies. FOD material 152 and 172 provide for attachment of a high density selective shielding structure, i.e., shielding layers 150 and 170. By attaching or securing shielding layers 150 and 170 with FOD material 152 and 172, the shielding layers can be placed in the optimal location for its intended purpose, without the concern for component spacing to support the shielding layer, as described in the background. The mechanical and structural support for selective placement of shielding layers 150 and 170 is provided by FOD material 152 and 172. The shielding layers can be placed in any desired or selected location and attached to the adjacent component with FOD material. In this case, electrical component 140 and bond wires 148, being the adjacent component, can be used as the attachment or anchor point for shielding layer 150 using FOD material 152. In addition, shielding layer 150, being the adjacent component, can be used as the attachment or anchor point for shielding layer 170 using FOD material 172. Electromagnetic shielding layers 150, 170, and 176 reduces or inhibits EMI, RFI, and other inter-device interference, for example as radiated by high-speed digital devices, from affecting neighboring devices within or adjacent to SIP module 178.

Figure 4A:
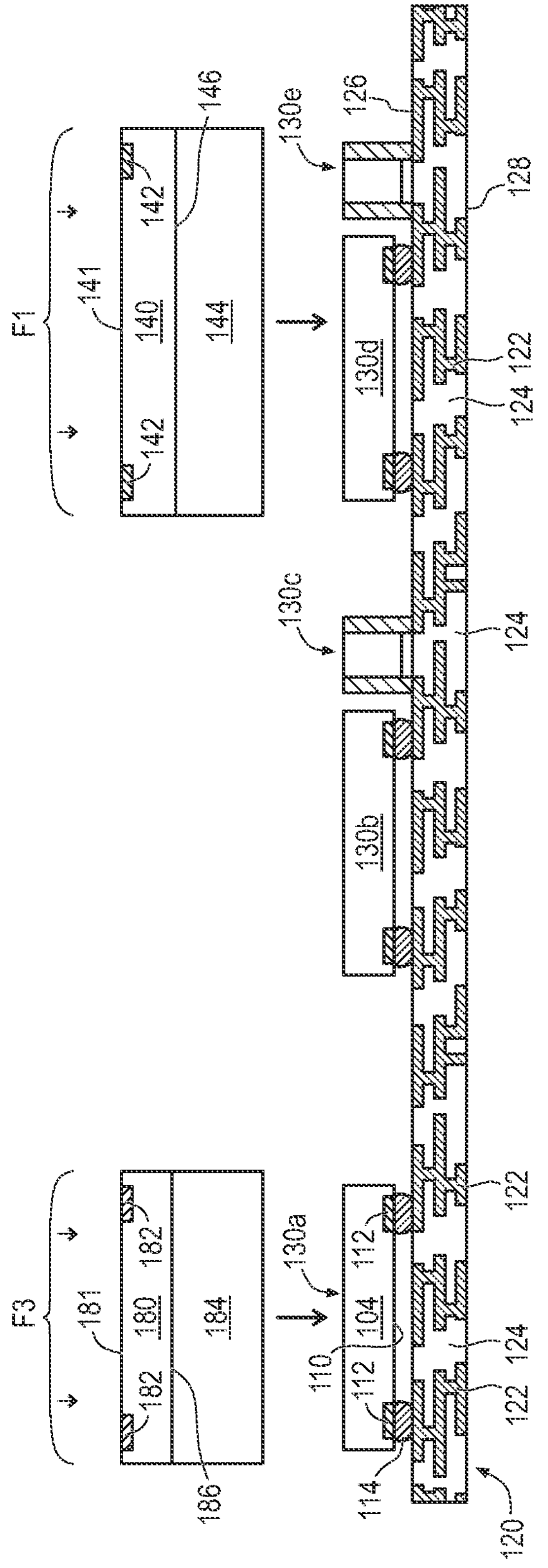
FIGS. 4*a*-4*j* illustrate further selective shielding with FOD material.
Figure 4B:
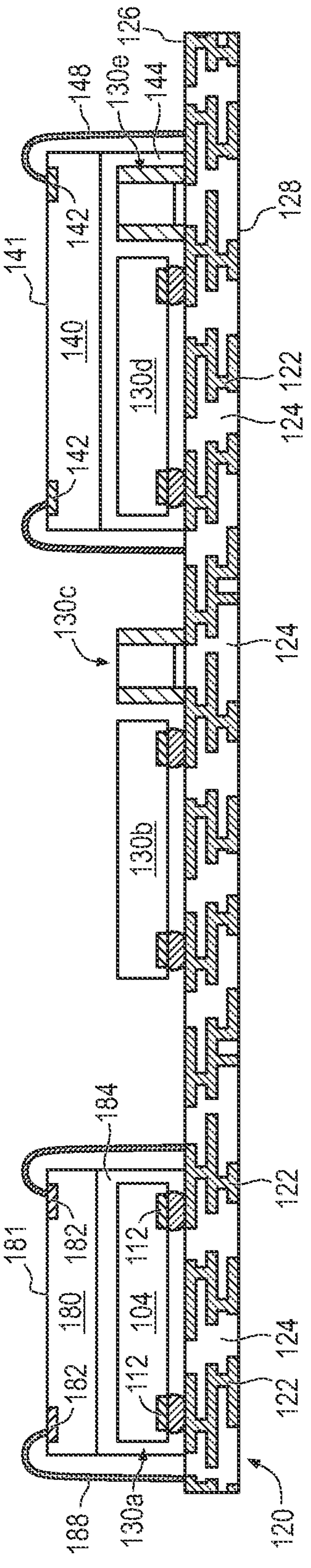

In another embodiment, continuing from FIG. 2*c*, electrical component 180 is positioned over electrical component 130*a* above substrate 120 using a pick and place operation, as shown in FIG. 4*a*. Electrical component 180 can be similar to semiconductor die 104 from FIG. 1*c*, although possibly having a different form and function, with active surface 181 and contact pads 182 oriented away from surface 126 of substrate 120. Alternatively, electrical component 180 can include other semiconductor die, semiconductor packages, surface mount devices, RF component, discrete electrical devices, or IPDs, such as a resistor, capacitor, and inductor. FOD material 184 is formed or deposited on back surface 186 of electrical component 180 and oriented toward electrical component 130*a*. FOD material 184 can be a penetrable thin film, polymer, epoxy, acryl-based B-stage material, or other similar material with penetrable properties. FOD material 184 is pressed over electrical component 130*a*, with force F3, to cover or enclose the components within the FOD material, as shown in FIG. 4*b*. FOD material 184 provides a point of attachment between electrical component 180 and electrical component 130*a* for mechanical and structural support.

Bond wires 188 are formed between contact pads 182 on active surface 181 of electrical component 180 and conductive layer 122 on interconnect substrate 120. Bond wires 188 provide electrical interconnect between electrical component 180 and interconnect substrate 120.

Electrical component 140, FOD material 144, shielding layer 150, and FOD material 152 follows the process as described in FIGS. 2*d*-2*j*. Components having a similar function are assigned the same reference number in the figures.

Alternatively, FOD material 184 is formed or deposited over electrical component 130*a*, and then electrical component 180 is pressed onto the FOD material.

Figure 4C:
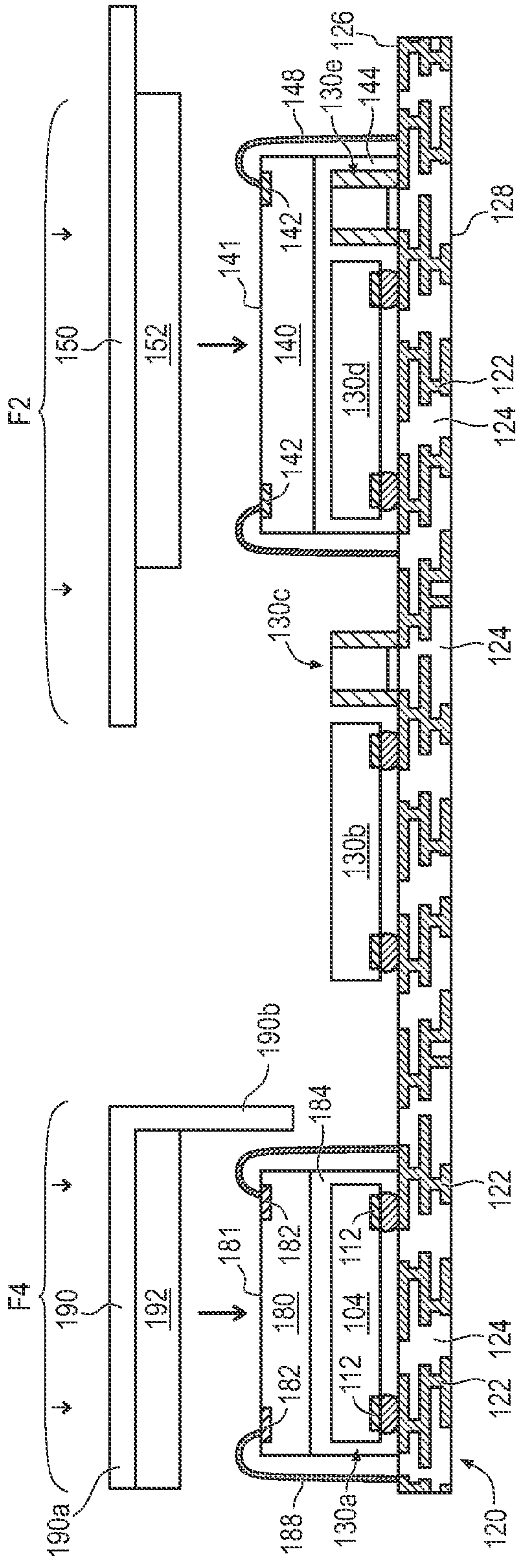

In FIG. 4*c*, electromagnetic shielding layer 190 is positioned over electrical components 130*a*, 180, and surface 126 of interconnect substrate 120. Shielding layer 190 includes a horizontal portion 190*a* and vertical portion 190*b*. Shielding layer 190 can be one or more layers of Al, Cu, Sn, Ni, Au, Ag, or other suitable conductive material. Alternatively, shielding layer 190 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding layer 190*b* extends vertically along a side surface of electrical component 180, and along a side surface of electrical component 130*a*. FOD material 192 is formed or deposited on a surface of shielding layer 190*a* and oriented toward electrical components 130*a* and 180. FOD material 192 can be a penetrable thin film, polymer, epoxy, acryl-based B-stage material, or other similar material with penetrable properties. FOD material 192 is pressed over bond wires 188 extending from electrical component 180, with force f4, to cover or enclose the bond wires within the FOD material. FOD material 192 provides a point of attachment between shielding layer 190 and surface 181 of electrical component 180 and bond wires 188 for mechanical and structural support for selective placement of the shielding layer. In this case, electrical component 180 and bond wires 188, being the adjacent component, can be used as the attachment or anchor point for shielding layer 190 using FOD material 192.

Figure 4D:
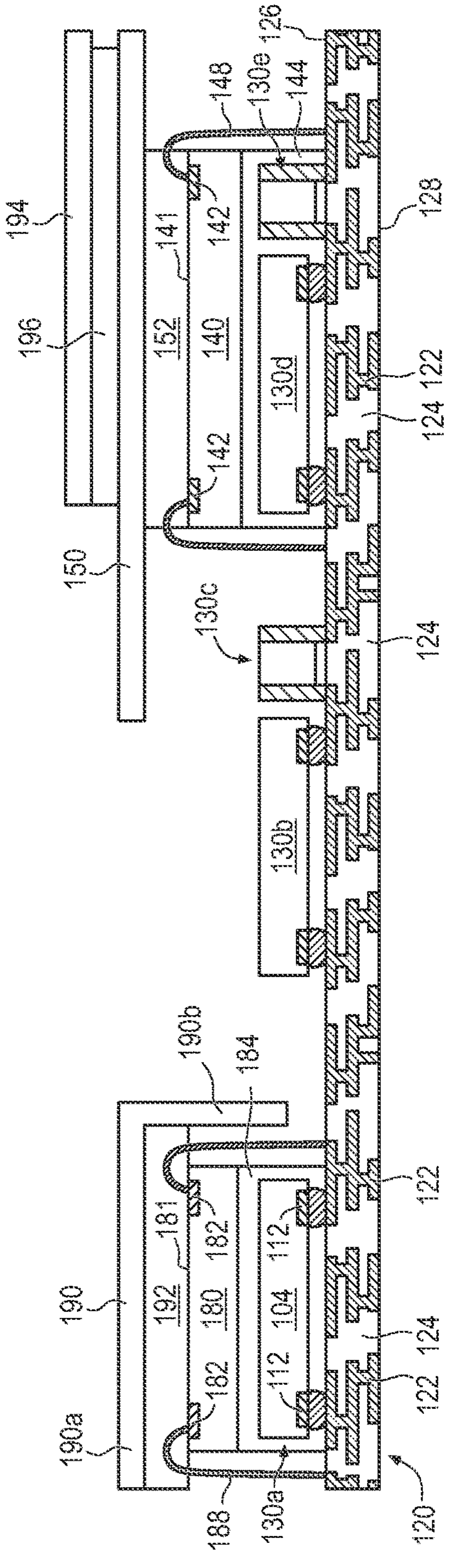

FIG. 4*d* illustrates shielding layer 190*a* pressed over bond wires 188 extending from electrical component 180 to cover or enclose the bond wires within FOD material 192. In one case, shielding layer 190*b* stops short of substrate 120. FOD material 192 is disposed between shielding layer 190 and electrical component 180 and bond wires 188 to provide attachment and mechanical and structural support for selective placement of the shielding layer.

Alternatively, FOD material 192 is formed or deposited over electrical component 180 and bond wires 188, and then shielding layer 190 is pressed onto the FOD material.

An electromagnetic shielding layer 194 is positioned over shielding layer 150. Shielding layer 194 can be one or more layers of Al, Cu, Sn, Ni, Au, Ag, or other suitable conductive material. Alternatively, shielding layer 194 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. FOD material 196 is formed or deposited on a surface of shielding layer 194 and oriented toward shielding layer 150. FOD material 196 can be a penetrable thin film, polymer, epoxy, acryl-based B-stage material, or other similar material with penetrable properties. FOD material 196 is pressed over the surface of shielding layer 150. FOD material 196 provides a point of attachment between shielding layer 194 and shielding layer 150 for mechanical and structural support for selective placement of the shielding layer. In this case, shielding layer 150, being the adjacent component, can be used as the attachment or anchor point for shielding layer 194 using FOD material 196.

Figure 4E:
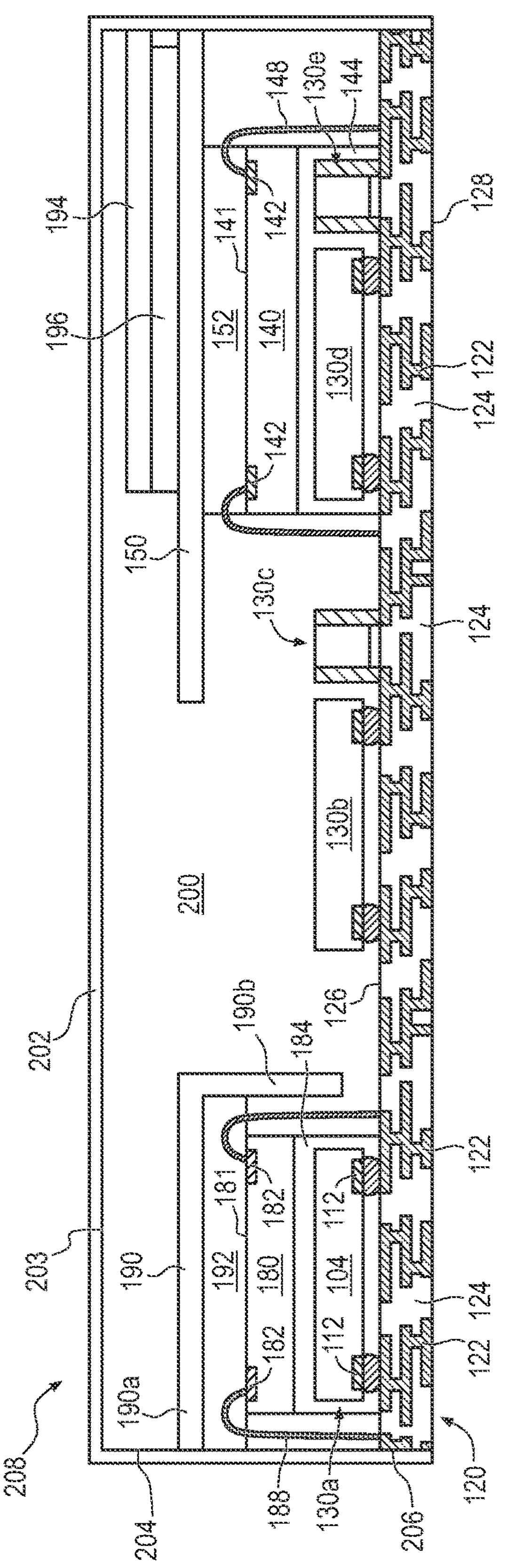

In FIG. 4*e*, an encapsulant or molding compound 200 is deposited over and around electrical components 130*a*-130*e* on substrate 120 using a paste printing, compressive molding, transfer molding, liquid encapsulant molding, vacuum lamination, spin coating, or other suitable applicator. Encapsulant 200 can be polymer composite material, such as epoxy resin with filler, epoxy acrylate with filler, or polymer with proper filler. Encapsulant 200 is non-conductive, provides structural support, and environmentally protects the semiconductor device from external elements and contaminants. Any portions of shield layers 150, 190, and 194 extending beyond encapsulant 200 are singulated, similar to FIG. 2*i*. Shielding layers 150, 190, and 194 are exposed from encapsulant 200 post singulation.

An electromagnetic shielding layer 202 is formed or disposed over surface 203 of encapsulant 200 by conformal application of shielding material. Shielding layer 202 can be one or more layers of Al, Cu, Sn, Ni, Au, Ag, or other suitable conductive material. Alternatively, shielding layer 202 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 202 covers side surfaces 204 of encapsulant 200, as well as side surfaces 206 of interconnect substrate 120. Electrical components 130*a*-130*e*, as mounted to interconnect substrate 120 and covered by encapsulant 200 and shielding layer 202, constitute SIP module 208.

Figure 4F:
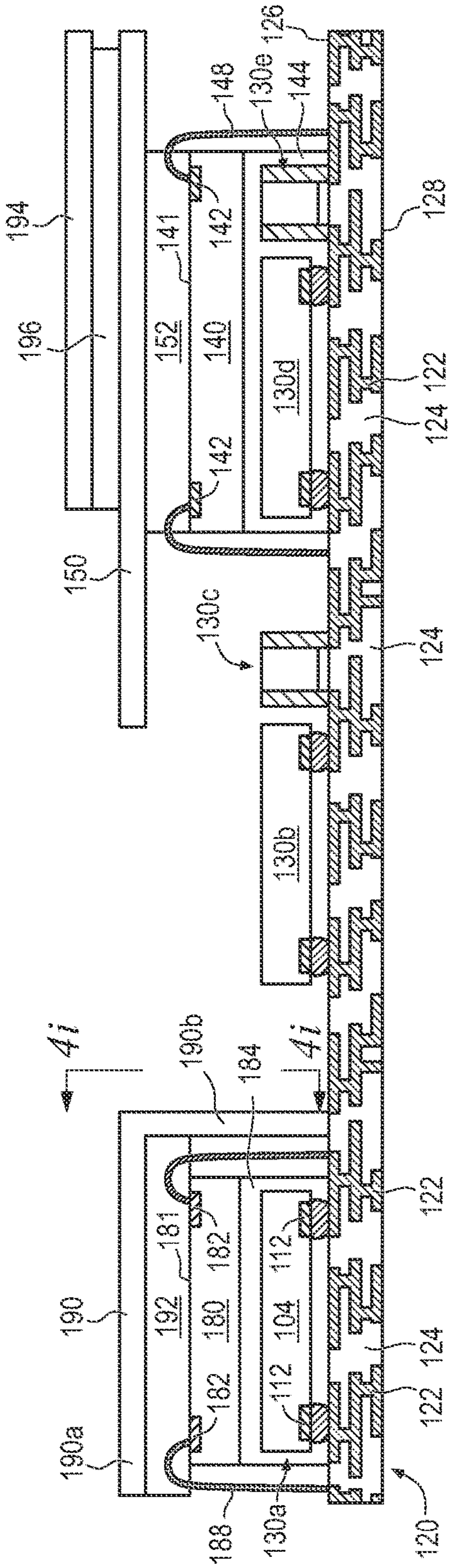

In another embodiment, continuing from FIG. 4*c*, shielding layer 190*a* is pressed over bond wires 188 extending from electrical component 180 to cover or enclose the bond wires within FOD material 192, as shown in FIG. 4*f*. Shielding layer 190*b* contacts substrate 120 to make ground connection to conductive layer 122. FOD material 192 is disposed between shielding layer 190 and electrical component 180 and bond wires 188 to provide attachment and mechanical and structural support for selective placement of the shielding layer.

Figure 4G:
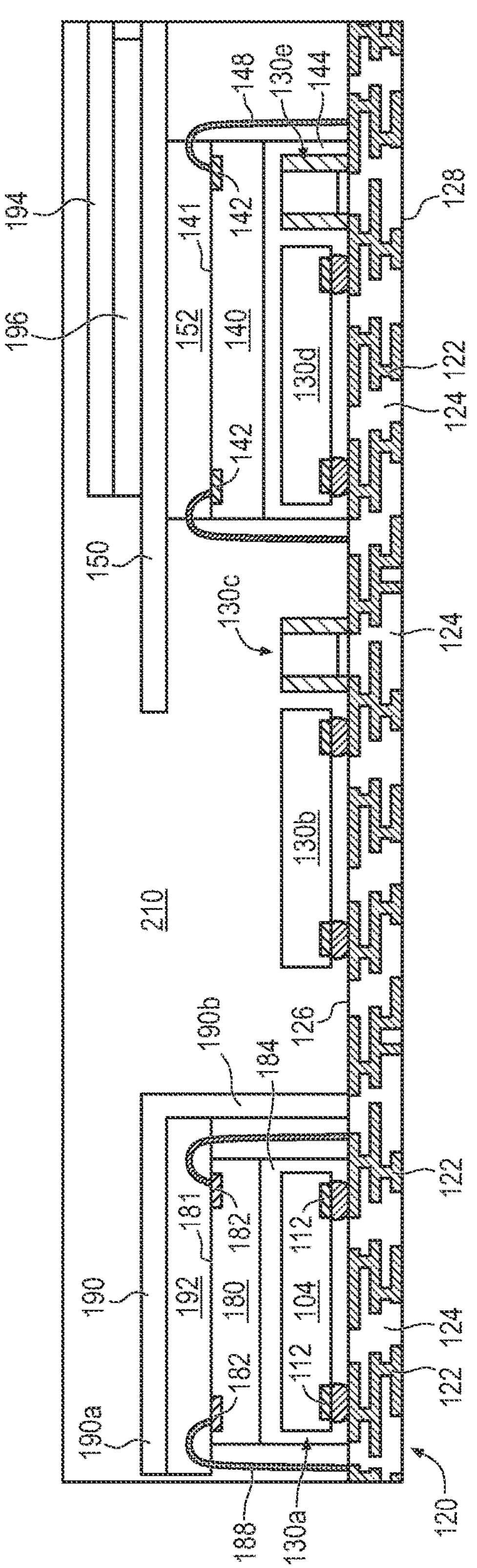

In FIG. 4*g*, an encapsulant or molding compound 210 is deposited over and around electrical components 130*a*-130*e* on substrate 120 using a paste printing, compressive molding, transfer molding, liquid encapsulant molding, vacuum lamination, spin coating, or other suitable applicator. Encapsulant 210 can be polymer composite material, such as epoxy resin with filler, epoxy acrylate with filler, or polymer with proper filler. Encapsulant 210 is non-conductive, provides structural support, and environmentally protects the semiconductor device from external elements and contaminants. Any portions of shield layers 150 and 194 extending beyond encapsulant 210 are singulated, similar to FIG. 2*i*. Shielding layers 150 and 194 are exposed from encapsulant 210 post singulation.

Figure 4H:
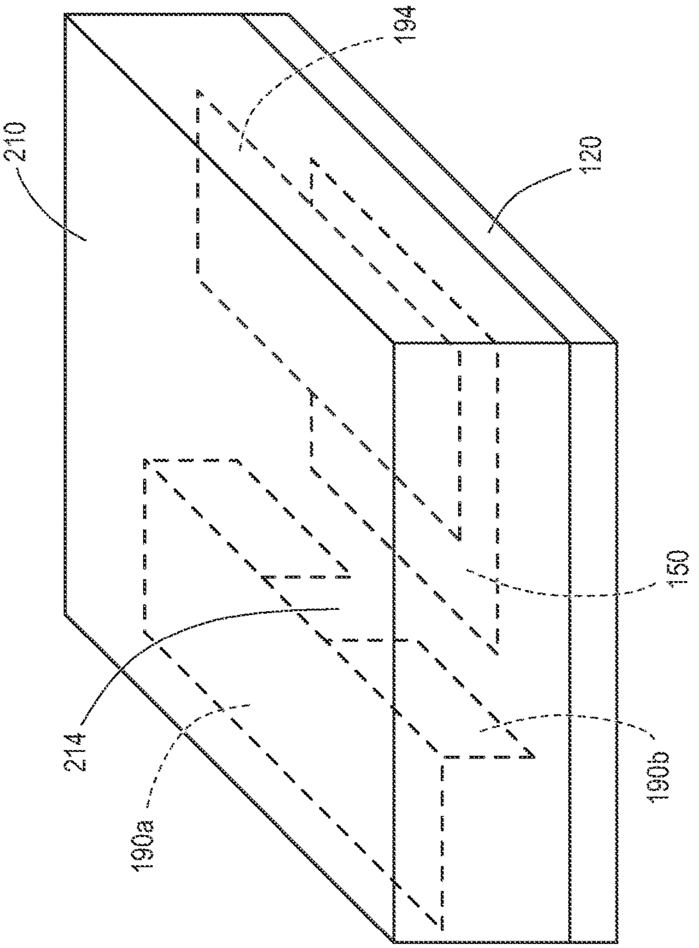
Figure 4I:
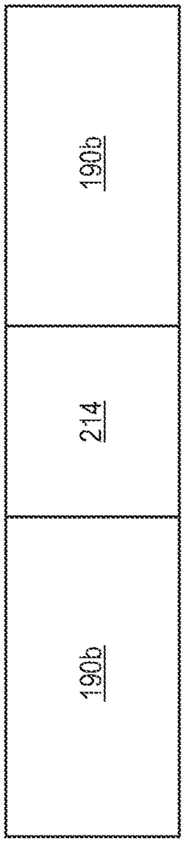

FIG. 4*h* shows a perspective view of the package with substrate 120, encapsulant 210, and shielding layers 150, 190, and 194 within the encapsulant. Shielding layer 190*b* may have a window or opening 214. FIG. 4*i* shows shielding layer 190*b* in isolation with opening 214.

Figure 4J:
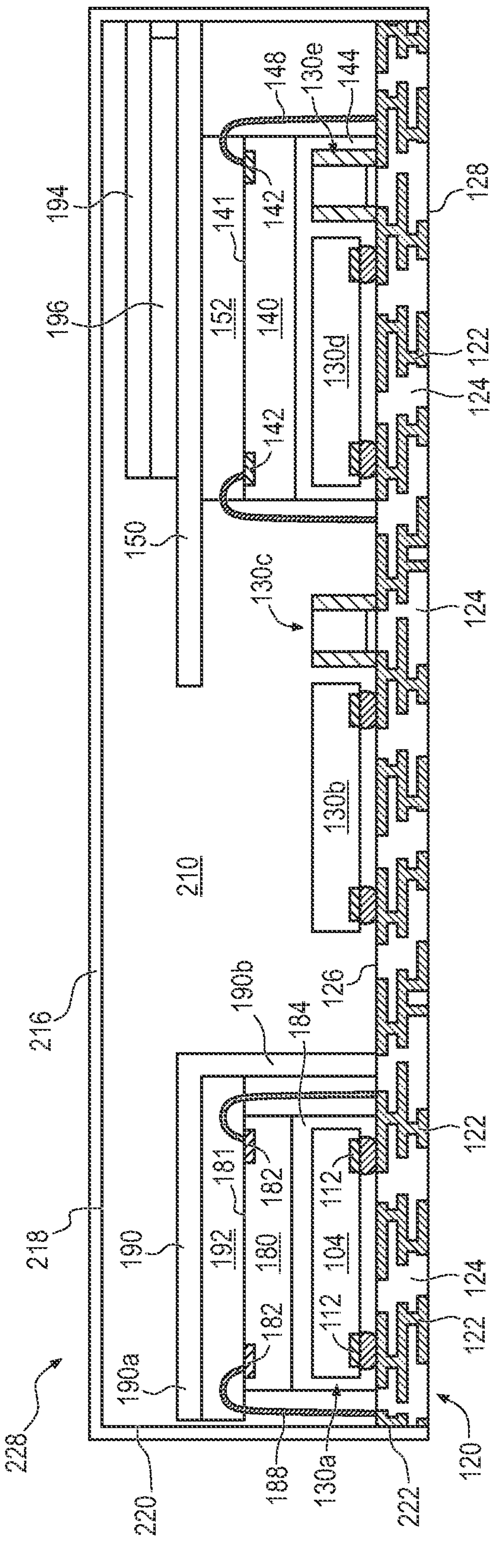

In FIG. 4*j*, an electromagnetic shielding layer 216 is formed or disposed over surface 218 of encapsulant 210 by conformal application of shielding material. Shielding layer 216 can be one or more layers of Al, Cu, Sn, Ni, Au, Ag, or other suitable conductive material. Alternatively, shielding layer 216 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. In addition, shielding layer 216 covers side surfaces 220 of encapsulant 210, as well as side surfaces 222 of interconnect substrate 120. Electrical components 130*a*-130*e*, as mounted to interconnect substrate 120 and covered by encapsulant 210 and shielding layer 202, constitute SIP module 228.

SIP module 208, 228 includes high speed digital and RF electrical components 130*a*-130*e*, highly integrated for small size and low height, and operating at high clock frequencies. FOD material 192 provides for attachment of a high density selective shielding structure, i.e., shielding layer 190. FOD material 152 provides for attachment of a high density selective shielding structure, i.e., shielding layer 150. By attaching or securing shielding layers 150 and 190 with FOD material 152 and 192, the shielding layers can be placed in the optimal location for its intended purpose, without the concern for component spacing to support the shielding layer, as described in the background. The mechanical and structural support for selective placement of shielding layers 150 and 190 is provided by FOD material 152 and 192. The shielding layers can be placed in any desired or selected location and attached to the adjacent component with FOD material. In this case, electrical component 180 and bond wires 188, being the adjacent component, can be used as the attachment or anchor point for shielding layer 190 using FOD material 192. In a similar manner, shielding layer 150, being the adjacent component, can be used as the attachment or anchor point for shielding layer 194 using FOD material 196. Electromagnetic shielding layers 150, 192, 196, 212, and 216 reduce or inhibit EMI, RFI, and other inter-device interference, for example as radiated by high-speed digital devices, from affecting neighboring devices within or adjacent to SIP module 208, 228.

Figure 5:
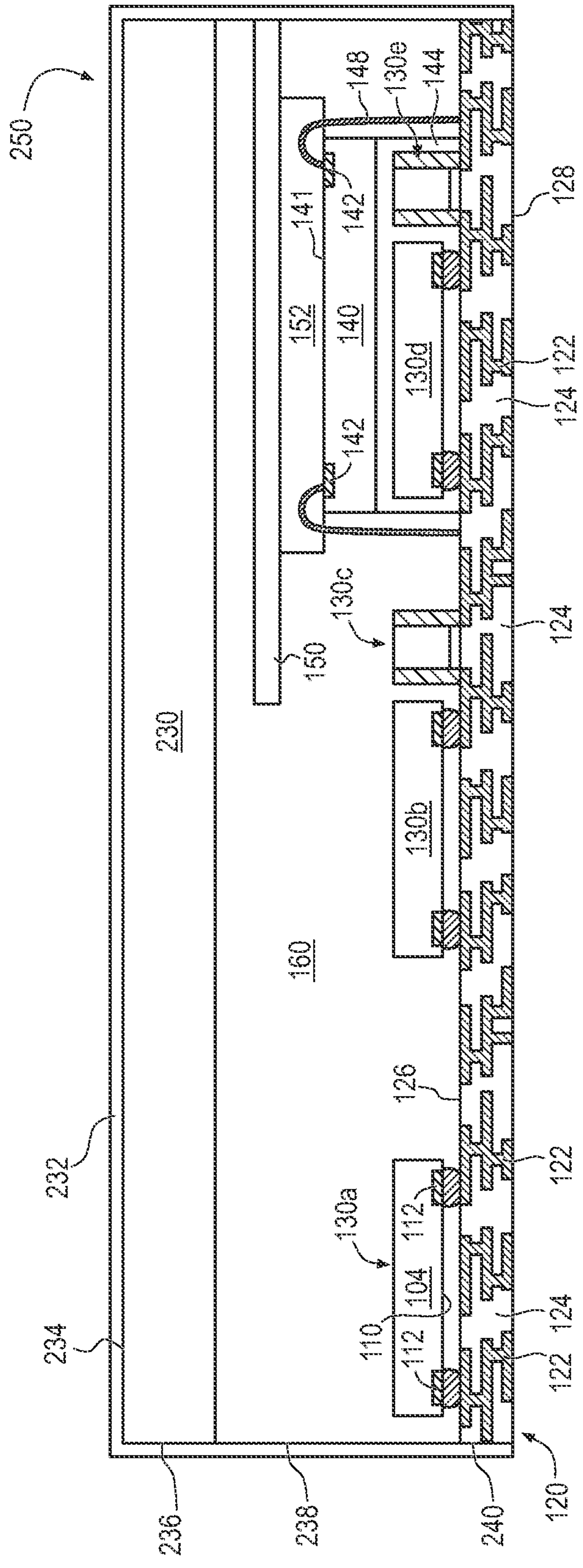
FIG. 5 illustrates an alternate selective shielding with FOD material.

In another embodiment, continuing from FIG. 2*g*, encapsulant or molding compound 160 is deposited over and around electrical components 130*a*-130*e* on substrate 120, as described above. In FIG. 5, a second encapsulant or molding compound 230 is deposited over encapsulant 160 using a paste printing, compressive molding, transfer molding, liquid encapsulant molding, vacuum lamination, spin coating, or other suitable applicator. Encapsulant 230 can be polymer composite material, such as epoxy resin with filler, epoxy acrylate with filler, or polymer with proper filler. Encapsulant 230 is non-conductive, provides structural support, and environmentally protects the semiconductor device from external elements and contaminants. Any portion of shield layer 150 extending beyond encapsulant 160 is singulated, similar to FIG. 2*i*. Shielding layer 150 is exposed from encapsulant 160 post singulation.

An electromagnetic shielding layer 232 is formed or disposed over surface 234 of encapsulant 230 by conformal application of shielding material. Shielding layer 232 can be one or more layers of Al, Cu, Sn, Ni, Au, Ag, or other suitable conductive material. Alternatively, shielding layer 232 can be carbonyl iron, stainless steel, nickel silver, low-carbon steel, silicon-iron steel, foil, conductive resin, carbon-black, aluminum flake, and other metals and composites capable of reducing or inhibiting the effects of EMI, RFI, and other inter-device interference. Shielding layer 232 contacts the portion of shielding layer 150 exposed from encapsulant 160. In addition, shielding layer 232 covers side surfaces 236 of encapsulant 230 and side surfaces 238 of encapsulant 160, as well as side surfaces 240 of interconnect substrate 120. Electrical components 130*a*-130*e*, as mounted to interconnect substrate 120 and covered by encapsulant 160, 210 and shielding layer 232, constitute SIP module 250.

SIP module 250 includes high speed digital and RF electrical components 130*a*-130*e*, highly integrated for small size and low height, and operating at high clock frequencies. FOD material 152 provides for attachment of a high density selective shielding structure, i.e., shielding layer 150. By attaching or securing shielding layer 150 with FOD material 152, the shielding layer can be placed in the optimal location for its intended purpose, without the concern for component spacing to support the shielding layer, as described in the background. The mechanical and structural support for selective placement of shielding layer 150 is provided by FOD material 152. Electromagnetic shielding layers 150 and 232 reduce or inhibit EMI, RFI, and other inter-device interference, for example as radiated by high-speed digital devices, from affecting neighboring devices within or adjacent to SIP module 250.

Figure 6:
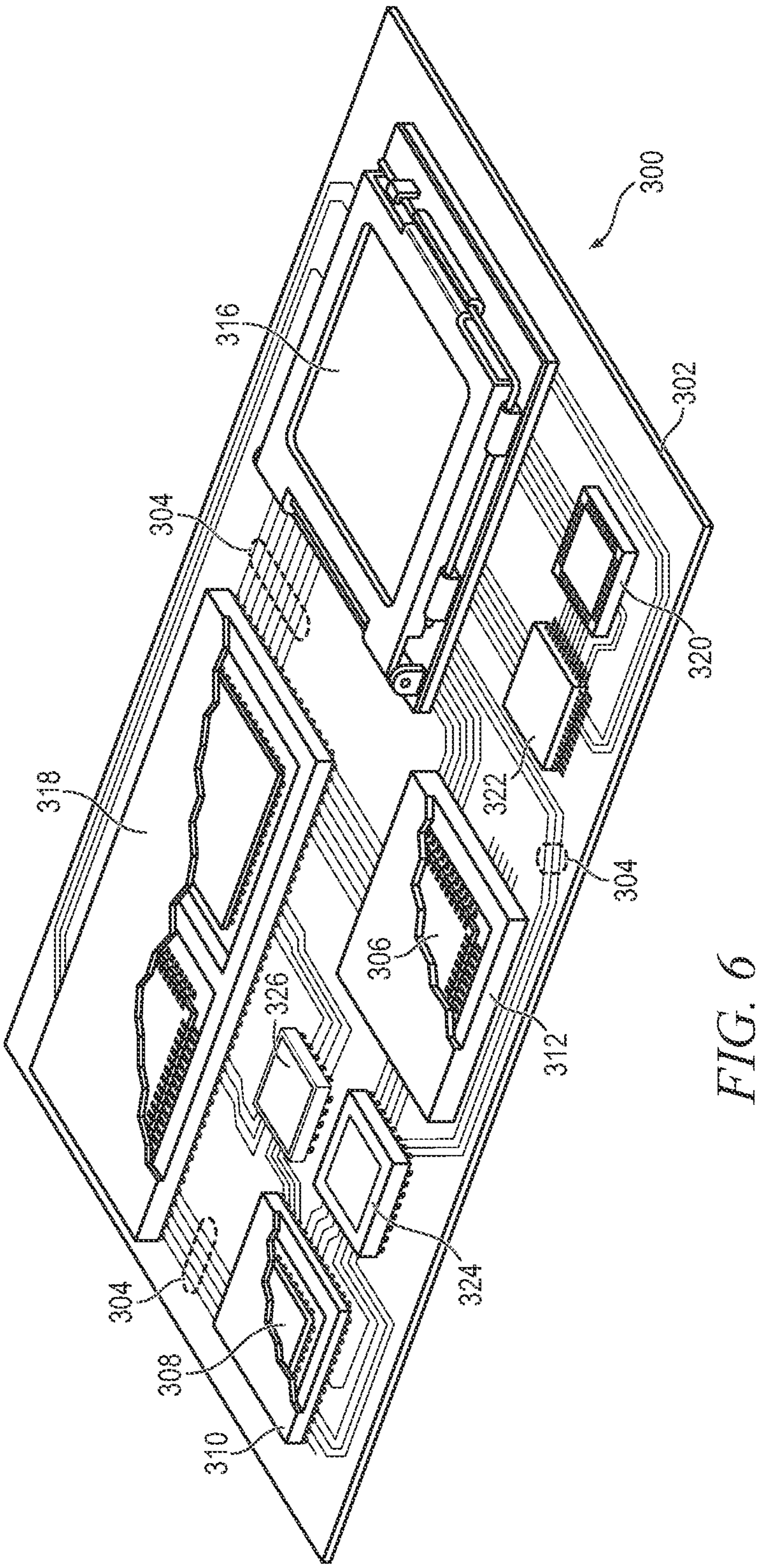
FIG. 6 illustrates a printed circuit board (PCB) with different types of packages mounted to a surface of the PCB.

FIG. 6 illustrates electronic device 300 having a chip carrier substrate or PCB 302 with a plurality of semiconductor packages mounted on a surface of PCB 302, including SIP modules 168, 178, 208, 228, and 250. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 6, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:

a substrate;

a first electrical component disposed over a surface of the substrate;

a wire bond formed between a surface of the first electrical component opposite the substrate and the surface of the substrate;

a second electrical component disposed over the surface of the substrate;

a third electrical component disposed over the surface of the substrate;

a first shielding layer selectively disposed over the first electrical component to provide shielding for first electrical component with no portion of the first shielding layer being disposed within a vertical projection of the second electrical component;

a first film material selectively disposed between the first electrical component and first shielding layer and contacting the surface of the first electrical component for attachment of the first shielding layer to the first electrical component with a portion of the wire bond embedded in the first film material and no portion of the first film material being disposed within a vertical projection of the second electrical component;

a second film material disposed in contact with the first shielding layer and the first shielding layer extending beyond the second film material with a portion of the first shielding layer extending beyond the second film material being within a vertical projection of the third electrical component;

a second shielding layer disposed in contact with the second film material;

a first encapsulant deposited over and around the first electrical component, first shielding layer, second shielding layer, and substrate; and a third shielding layer disposed over the first encapsulant.

2. The semiconductor device of claim 1, further including:

a fourth electrical component disposed between the first electrical component and substrate within a vertical projection of the first electrical component; and a third film material disposed around the fourth electrical component and in contact with the first electrical component.

3. The semiconductor device of claim 1, wherein the first shielding layer and second shielding layer contact the third shielding layer.

4. The semiconductor device of claim 1, further including a second encapsulant deposited over the first encapsulant, wherein the third shielding layer is disposed over the second encapsulant.

5. A semiconductor device, comprising:

a first component;

a second component;

a first shielding layer selectively disposed over the first component to provide shielding for the first component with no portion of the first shielding layer being disposed over the second component; and a first film material selectively disposed between the first component and first shielding layer and contacting a surface of the first component for attachment of the first shielding layer to the first component with no portion of the first film material being disposed within a vertical projection of the second component.

6. The semiconductor device of claim 5, further including:

a second shielding layer disposed over the second component; and a second film material disposed between the second component and second shielding layer.

7. The semiconductor device of claim 5, further including:

a substrate, wherein the first component and second component are disposed over the substrate;

a third component disposed between the first component and substrate within a vertical projection of the first component; and a second film material disposed around the third component and in contact with the first component.

8. The semiconductor device of claim 5, further including a first encapsulant deposited over the first component.

9. The semiconductor device of claim 8, further including a second encapsulant deposited over the first encapsulant.

10. The semiconductor device of claim 9, further including a second shielding layer formed over the second encapsulant.

11. The semiconductor device of claim 5, further including a wire bond formed between the surface of the first component and a surface of the substrate, wherein a portion of the wire bond is embedded in the first film material.

12. The semiconductor device of claim 5, further including:

a substrate, wherein the first component and second component are disposed over the substrate;

a third component disposed over the substrate;

a second film material disposed in contact with the first shielding layer and the first shielding layer extending beyond the second film material over the third component;

a second shielding layer disposed in contact with the second film material;

a first encapsulant deposited over and around the first component, first shielding layer, second shielding layer, and substrate; and a third shielding layer disposed over the first encapsulant.

13. The semiconductor device of claim 12, wherein the first shielding layer and second shielding layer contact the third shielding layer.

14. The semiconductor device of claim 12, further including a second encapsulant deposited over the first encapsulant, wherein the third shielding layer is disposed over the second encapsulant.

15. A method of making a semiconductor device, comprising:

providing a substrate;

disposing a first electrical component over the substrate;

disposing a second electrical component over the substrate;

selectively disposing a first shielding layer over the first electrical component to provide shielding for first electrical component with no portion of the first shielding layer being disposed over the second electrical component; and selectively disposing a first film material between the first electrical component and first shielding layer and contacting a surface of the first electrical component for attachment of the first shielding layer with no portion of the first film material being disposed within a vertical projection of the second electrical component.

16. The method of claim 15, further including:

disposing a second shielding layer over the second electrical component; and disposing a second film material between the second electrical component and second shielding layer.

17. The method of claim 15, further including:

disposing a third electrical component disposed between the first electrical component and substrate within a vertical projection of the first electrical component; and disposing a second film material disposed around the third electrical component and in contact with the first electrical component.

18. The method of claim 15, further including depositing a first encapsulant over the first electrical component and substrate.

19. The method of claim 18, further including forming a second shielding layer over the first encapsulant.

20. The semiconductor device of claim 18, further including:

a second encapsulant deposited over the first encapsulant; and a second shielding layer disposed over the second encapsulant.

21. The method of claim 15, further including forming a wire bond between the surface of the first electrical component and a surface of the substrate, wherein a portion of the wire bond is embedded in the first film material.

22. The method of claim 15, further including:

disposing a third electrical component over the substrate;

disposing a second film material in contact with the first shielding layer and the first shielding layer extending beyond the second film material over the third electrical component;

disposing a second shielding layer in contact with the second film material;

depositing a first encapsulant over and around the first electrical component, first shielding layer, second shielding layer, and substrate; and disposing a third shielding layer over the first encapsulant.

23. The method of claim 22, wherein the first shielding layer and second shielding layer contact the third shielding layer third shielding layer.

24. The method of claim 22, further including:

depositing a second encapsulant over the first encapsulant; and disposing the third shielding layer over the second encapsulant.

25. A method of making a semiconductor device, comprising:

providing a first component;

providing a second component;

selectively disposing a first shielding layer over the first component to provide shielding for first component with no portion of the first shielding layer being disposed over the second component; and disposing a first film material between the first component and first shielding layer and contacting a surface of the first component for attachment of the first shielding layer to the first component.

26. The method of claim 25, further including:

disposing a second shielding layer over the second component; and disposing a second film material between the second component and second shielding layer.

27. The method of claim 25, further including:

providing a substrate, wherein the first component and second component are disposed over the substrate;

disposing a third component disposed between the first component and substrate within a vertical projection of the first component; and disposing a second film material around the third component and in contact with the first component.

28. The method of claim 25, further including depositing an encapsulant over the first component.

29. The method of claim 28, further including forming a second shielding layer over the encapsulant.

30. The method of claim 25, further including forming a wire bond between the surface of the first component and a surface of the substrate, wherein a portion of the wire bond is embedded in the first film material.

31. The method of claim 25, further including:

providing a substrate;

disposing the first component and second component over the substrate;

disposing a third component over the substrate;

disposing a second film material in contact with the first shielding layer and the first shielding layer extending beyond the second film material over the third component;

disposing a second shielding layer in contact with the second film material;

depositing a first encapsulant over and around the first component, first shielding layer, second shielding layer, and substrate; and disposing a third shielding layer over the first encapsulant.

32. The method of claim 31, wherein the first shielding layer and second shielding layer contact the third shielding layer.

33. The method of claim 31, further including:

depositing a second encapsulant over the first encapsulant; and disposing the third shielding layer over the second encapsulant.

* * * * *